United States Patent
Tsai et al.

(10) Patent No.: US 10,236,889 B1
(45) Date of Patent: Mar. 19, 2019

(54) MULTI-GHZ FULLY SYNTHESIZABLE CMOS FRACTIONAL DIVIDER

(71) Applicant: Ambarella, Inc., Santa Clara, CA (US)

(72) Inventors: Tu-I Tsai, Pleasanton, CA (US); David Chiong, Daly City, CA (US); Dennis He, San Jose, CA (US); Chien-Tang Hu, San Jose, CA (US)

(73) Assignee: Ambarella, Inc., Santa Clara, CA (US)

( * ) Notice: Subject to any disclaimer, the term of this patent is extended or adjusted under 35 U.S.C. 154(b) by 0 days.

(21) Appl. No.: 15/898,527

(22) Filed: Feb. 17, 2018

(51) Int. Cl.
*H03K 21/08* (2006.01)
*G06F 1/06* (2006.01)

(52) U.S. Cl.
CPC ............... *H03K 21/08* (2013.01); *G06F 1/06* (2013.01)

(58) Field of Classification Search
CPC .................................. H03K 21/08; G06F 1/06
USPC .................. 327/115, 147–163; 375/373–376
See application file for complete search history.

(56) References Cited

U.S. PATENT DOCUMENTS

2016/0087636 A1* 3/2016 Lai ..................... H03K 23/68
327/115

* cited by examiner

*Primary Examiner* — Thomas Skibinski
(74) *Attorney, Agent, or Firm* — Christopher P. Maiorana, PC

(57) ABSTRACT

An apparatus includes a fractional divider and a modulator circuit. The fractional divider circuit may be configured to generate a feedback clock signal in response to a selection signal, a divided clock signal and an output clock signal. The modulator circuit may be configured to generate the selection signal in response to the feedback clock signal. The fractional divider may generate four phase clock signals from the divided clock signal. The four phase clock signals may be interleaved by the fractional divider circuit to select one of the four phase clock signals as the feedback clock signal. The fractional divider operates at a divide-by-4 clock speed. The selection signal may be synchronized in response to the divided clock signal to generate the feedback clock signal. The fractional divider circuit may be implemented using CMOS logic.

18 Claims, 6 Drawing Sheets

MULTI-GHZ FULLY SYNTHESIZABLE CMOS FRACTIONAL DIVIDER

FIELD OF THE INVENTION

The invention relates to frequency dividers generally and, more particularly, to a method and/or apparatus for implementing a multi-GHz fully synthesizable CMOS fractional divider.

BACKGROUND

Conventional complementary metal-oxide semiconductor (CMOS) logic technology has a speed limitation. For frequencies above 5 GHz, in a Fractional-N mode phase-locked loop (PLL) circuit a voltage control oscillator (VCO) output clock has to go to a high speed divider before going into the Delta Sigma Modulator (DSM) and wide range slow divider. The quantization noise source of the DSM can be amplified by the divide ratio of the high speed divider.

Reducing the divide ratio of the high speed divider can reduce the quantization noise. However, the output frequency from the high speed divider is limited due to CMOS technology limitations. Complicated calibration schemes and current-mode logic (CML) are conventionally implemented to resolve the limitations. However, calibration schemes and CML increase design complication, increase power and increase area.

It would be desirable to implement a multi-GHz fully synthesizable CMOS fractional divider.

SUMMARY

The invention concerns an apparatus comprising a fractional divider and a modulator circuit. The fractional divider circuit may be configured to generate a feedback clock signal in response to a selection signal, a divided clock signal and an output clock signal. The modulator circuit may be configured to generate the selection signal in response to the feedback clock signal. The fractional divider may generate four phase clock signals from the divided clock signal. The four phase clock signals may be interleaved by the fractional divider circuit to select one of the four phase clock signals as the feedback clock signal. The fractional divider operates at a divide-by-4 clock speed. The selection signal may be synchronized in response to the divided clock signal to generate the feedback clock signal. The fractional divider circuit may be implemented using CMOS logic.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a multi-GHz fully synthesizable CMOS fractional divider that may (i) implement CMOS logic, (ii) implement a fixed divide-by-4 high speed divider, (iii) implement a fractional divider with the wide range of a slow divider operating in a full rate, (iv) reduce area, power and design complexity, (v) interleave four phase clock signals and/or (vi) be implemented as one or more integrated circuits.

Figure 1:
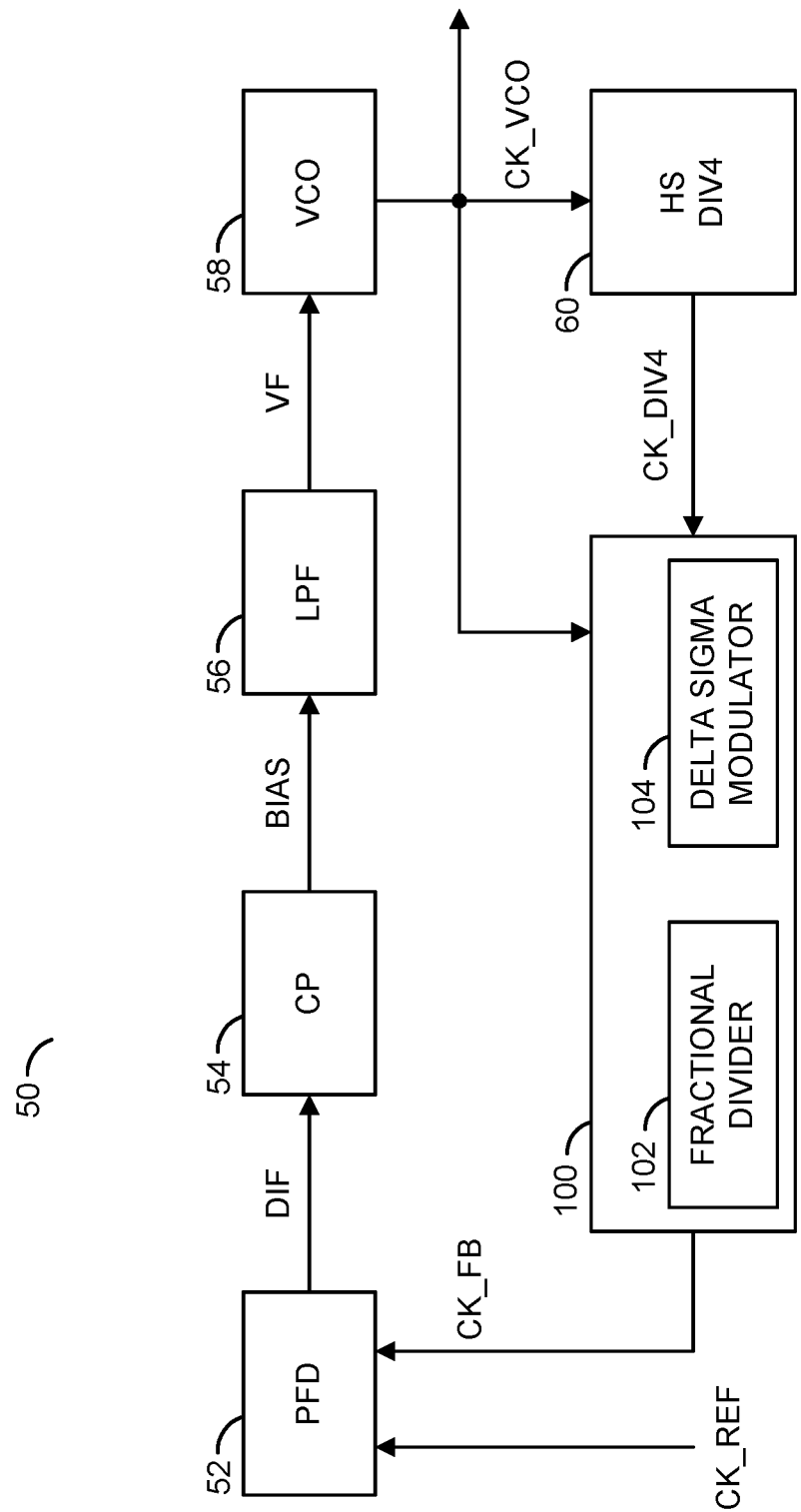
FIG. 1 is a diagram illustrating a context of the present invention.

Referring to FIG. 1, a diagram illustrating a circuit 50 providing a context of the present invention is shown. The circuit 50 may be a timing circuit. In the example shown, the circuit 50 may implement a Fractional-N mode digital phase-locked loop (PLL). The circuit 50 may comprise a block (or circuit) 52, a block (or circuit) 54, a block (or circuit) 56, a block (or circuit) 58, a block (or circuit) 60 and/or a block (or circuit) 100. The circuit 52 may implement a phase frequency detector. The circuit 54 may implement a charge pump. The circuit 56 may implement a loop filter. The circuit 58 may implement a voltage-controlled oscillator. The circuit 60 may implement a divider circuit. The circuit 100 may be an example embodiment of the apparatus. The circuit 50 may comprise other components (not shown). The implementation of the circuit 50 may be varied according to the design criteria of a particular implementation.

The circuit 50 may be configured to change the division ratio within a digital PLL (DPLL). Generally, the output of PLLs is an integral multiple of the comparison frequency (e.g., if the division ratio of the divider 60 is N, then the output frequency may be N times the comparison frequency). For applications that use a small step size (e.g., circuits using continual tuning), the apparatus 100 may be implemented to enable Fractional-N synthesis. Fractional-N frequency synthesizers may change the division ratio to provide an output frequency that may not be an integral multiple of the comparison frequency (e.g., a fractional divide ratio).

The phase frequency detector (PFD) 52 may receive a signal (e.g., CK_REF) and/or a signal (e.g., CK_FB). The signal CK_REF may be a reference input clock signal. The signal CK_FB may be a feedback clock signal. The PFD 52 may be configured to perform a comparison between the signal CK_REF and the signal CK_FB (e.g., the two input signals). The PFD 52 may generate a signal (e.g., DIF). The signal DIF may represent a phase difference (e.g., error difference) between the signal CK_REF and the signal CK_FB. The signal DIF may be proportional to the phase difference. In one example, the signal DIF may provide up/down pulses.

The charge pump (CP) 54 may receive the signal DIF. The CP 54 may implement a bipolar switched current source. The CP 54 may generate a signal (e.g., BIAS). The signal BIAS may be a voltage that sets the negative and/or positive charge pump currents to and/or from the loop filter 56.

The loop filter (LPF) 56 may implement a low-pass filter. The LPF 56 may be configured to average the phase-error signal. The LPF 56 may determine the stability of the loop and/or limit an amount of ripple from the output of the PFD 52. The LPF 56 may lock when the signal CK_REF and the signal CK_FB have the same frequency. The LPF 56 may receive the signal BIAS. The LPF 56 may present a signal (e.g., VF) to the voltage-controlled oscillator 58.

The voltage-controlled oscillator (VCO) 58 may receive the signal VF. The VCO may generate a signal (e.g., CK_VCO). The signal CK_VCO may be an output clock signal of the PLL circuit 50. The signal CK_VCO may provide a variable frequency. The frequency of the signal CK_VCO may be controlled in response to the signal VF. The signal CK_VCO may be presented to the divider circuit 60 and/or the apparatus 100. The VCO 58 may operate at a frequency equal to the division ratio times the phase comparison frequency.

The divider circuit 60 may receive the signal CK_VCO. The divider circuit 60 may generate a signal (e.g., CK_DIV4) in response to the signal CK_VCO. The divider circuit 60 may be configured as a high-speed divide-by-4 circuit. The divider circuit 60 may have a fixed divide-by-4 ratio. For example, the signal CK_DIV4 may operate at a frequency that is approximately one quarter the frequency of the output clock signal CK_VCO.

The apparatus 100 may be configured to receive the signal CK_VCO and/or the signal CK_DIV4. The apparatus 100 may generate the signal CK_FB. The signal CK_FB generated by the apparatus 100 may be the divided output signal CK_VCO. The apparatus 100 may comprise a block (or circuit) 102 and/or a block (or circuit) 104. The circuit 102 may implement a fractional divider. The circuit 104 may implement a delta sigma modulator. The apparatus 100 may comprise other components (not shown). Details of the fractional divider 102, the delta sigma modulator (DSM) 104 and/or the other components of the apparatus 100 may be described in more detail in association with FIG. 5. The number, type and/or arrangement of the components of the apparatus 100 may be varied according to the design criteria of a particular implementation.

The apparatus 100 may be configured to implement Fractional-N synthesis. The apparatus 100 may alternate between division ratios (e.g., the proportion of the various division ratios selected may provide the fractional division ratio). Using the fractional division ratio, the apparatus 100 may be used to implement a small step frequency.

In some embodiments, the apparatus 100 and/or the circuit 50 may implement advanced CMOS logic. For example, the full speed of the input clock CK_REF may be approximately 7 GHZ under state-of-the-art standard CMOS FinFET technology. Due to limitations in CMOS technology, the signal CK_DIV4 may not exceed 2.5 GHz. The apparatus 100 may be implemented to avoid increased power, increased area (e.g., chip size) and/or design complications introduced by resolving the limitations of CMOS technology (e.g., complicated calibration scheme and/or CML logic are usually implemented to resolve the limitations of CMOS logic).

Implementing the apparatus 100 instead of calibration schemes and/or CML logic, may reduce an amount of area used to implement the Fractional-N Synthesizable CMOS fractional divider. Implementing the apparatus 100 instead of calibration schemes and/or CML logic may reduce design complexity. For example, the verification effort may be reduced using a synthesize tool timing check instead of a circuit simulation (e.g., Spectre simulation). In another example, the implementation effort may be reduced because a customized layout may not be needed (e.g., a customized layout in FinFET CMOS technology is more difficult compared to older technology). Furthermore, since no Spectre simulation may be needed due to the fully synthesizable implementation of the apparatus 100, the apparatus 100 may provide more flexibility in switching technology.

Figure 2:
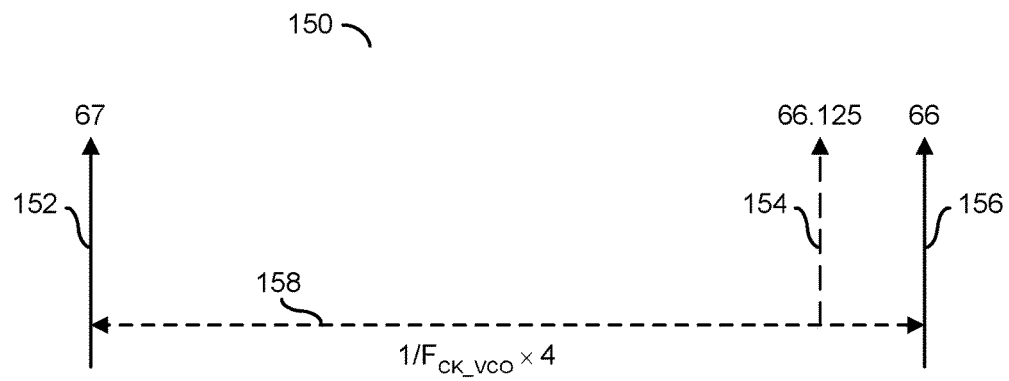
FIG. 2 is a diagram illustrating quantization noise for an example dividing ratio.

Referring to FIG. 2, a diagram illustrating quantization noise for an example dividing ratio 150 is shown. A line 152, a line 154, a line 156 and a line 158 are shown. The line 152 may represent an upper bound divide value integer. The upper bound divide value integer 152 is shown having a value of 67. The line 154 may represent an average divide ratio. The average divide ratio 154 is shown having a value of 66.125. The line 156 may represent a lower bound divide value integer. The lower bound divide value integer 156 is shown having a value of 66. The line 158 may represent an amount of quantization noise.

In the example shown, a frequency value (e.g., FCK_VCO) of the output clock signal CK_VCO may be desired to be 6.348 GHz and a value of the reference clock signal CK_REF may be 24 MHz. In the example shown, the high speed divide ratio (e.g., Ndiv_hs) may have a value of 4 (e.g., the value from the divider 60 would be approximately 1.587 GHz). In the example divide ratio 150, the fractional divider may operate at full rate. The quantization noise source for a DSM may be amplified 4 times (e.g., the value of Ndiv_hs). Without implementing the apparatus 100, a wide range slow divider and first order error feedback DSM may generate the average divide ratio 154 (e.g., Ndiv_DSM) having the value 66.125. For example, the value Ndiv_DSM may jump between the upper bound divide value integer 152 and the lower bound divide value integer 154 (e.g., jump between 67 and 66). With the value of Ndiv_hs equal to 4, the amount of quantization noise 158 may be 4×(1/FCK_VCO).

Figure 3:
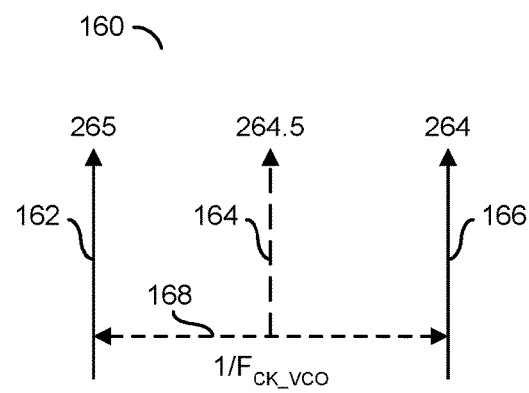
FIG. 3 is a diagram illustrating quantization noise for another example dividing ratio.

Referring to FIG. 3, a diagram illustrating quantization noise for another example dividing ratio 160 is shown. A line 162, a line 164, a line 166 and a line 168 are shown. The line 162 may represent an upper bound divide value integer. The upper bound divide value integer 162 is shown having a value of 265. The line 164 may represent an average divide ratio. The average divide ratio 164 is shown having a value of 264.5. The line 166 may represent a lower bound divide value integer. The lower bound divide value integer 166 is shown having a value of 264. The line 168 may represent an amount of quantization noise.

Continuing the example described in association with FIG. 2 (e.g., FCK_VCO desired at 6.348 GHz and the value of the reference clock signal CK_REF may be 24 MHz), the quantization noise may be reduced by using a lower high speed divide ratio value Ndiv_hs. In the example shown, the value of Ndiv_hs may be 1 (e.g., resulting in no amplification of the quantization noise and an output of the divider 60 would be approximately 6.348 GHz). In the example divide ratio 160, the fractional divider may have a wide range but not operate at full rate. Without implementing the apparatus 100, a wide range slow divider and first order error feedback DSM may generate the average divide ratio 164 (e.g., Ndiv_DSM) having the value 264.5. For example, the value Ndiv_DSM may jump between the upper bound divide value integer 162 and the lower bound divide value integer 164 (e.g., jump between 265 and 264). With the value of Ndiv_hs equal to 1, the amount of quantization noise 168 may be 1/FCK_VCO.

In the example dividing ratio 150 shown in association with FIG. 2 (e.g., when Ndiv_hs is equal to 4), the quantization noise is four times larger than the quantization noise in the example dividing ratio 160 shown in association with FIG. 3 (e.g., when Ndiv_hs is equal to 1). Generally, to keep the quantization noise lower, a lower value (e.g., 1) for Ndiv_hs may be preferred. However, due to the CMOS technology limitations, the output from the divider 60 cannot exceed 2.5 GHz. For example, Ndiv_hs may not be smaller than 4 in the application where the frequency of the signal CK_VCO (e.g., FCK_VCO) is greater than 6 GHz. The apparatus 100 may be implemented to resolve the CMOS technology limitations without using a complicated calibration scheme and/or CML logic.

Figure 4:
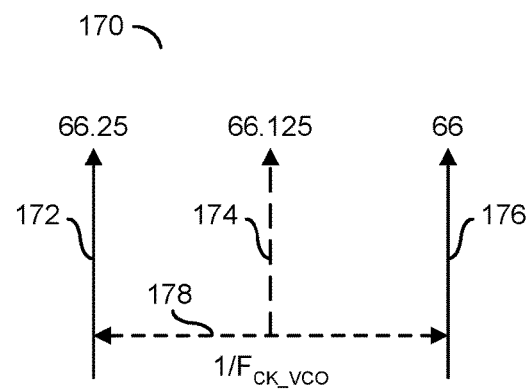
FIG. 4 is a diagram illustrating quantization noise for an example embodiment of the apparatus.

Referring to FIG. 4, a diagram illustrating quantization noise for an example embodiment 170 of the apparatus 100 is shown. A line 172, a line 174, a line 176 and a line 178 are shown. The line 172 may represent an upper bound divide value integer. The upper bound divide value integer 172 is shown having a value of 66.25. The line 174 may represent an average divide ratio. The average divide ratio 174 is shown having a value of 66.125. The line 176 may represent a lower bound divide value integer. The lower bound divide value integer 176 is shown having a value of 66. The line 178 may represent an amount of quantization noise.

Continuing the example, described in association with FIG. 2 and FIG. 3 (e.g., FCK_VCO desired at 6.348 GHz and the value of the reference clock signal CK_REF may be 24 MHz), the quantization noise may be reduced by implementing the apparatus 100 using the high-speed divide-by-4 circuit 60. The high-speed divide-by-4 circuit 60 may generate the signal CK_DIV4. The signal CK_DIV4 may have the divide ratio value Ndiv_hs equal to 4. Implementing the apparatus 100 may solve the 2.5 GHz limitation due to CMOS technology while limiting the quantization noise. For example, the apparatus 100 may implement the fractional divider 102 with the wide range of a slow divider while operating in a full rate.

The apparatus 100 may be configured to generate the average divide ratio 174 (e.g., Ndiv_DSM) having the value 66.125. For example, the value Ndiv_DSM may jump between the upper bound divide value integer 172 and the lower bound divide value integer 174 (e.g., jump between 66.25 and 66). Even with the value of Ndiv_hs equal to 4, the amount of quantization noise 178 generated using the apparatus 100 may be 1/FCK_VCO.

The apparatus 100 may be implemented using CMOS logic (e.g., instead of a complicated calibration scheme and/or CML logic). In one example, the CMOS logic may be implemented using FinFET technology. For example, the apparatus 100 may achieve the quantization noise similar to the example dividing ratio 160 shown in association with FIG. 3. The apparatus 100 may be implementing using the fixed divide-by-4 circuit 60 and/or the fully synthesizable CMOS fractional divider 102. For example, the fixed divide-by-4 circuit 60 may replace a traditional divider structure that would be used in association with FIG. 2 and/or FIG. 3. The apparatus 100 may implement advanced CMOS logic (e.g., such as Samsung 10 nm technology) to achieve a speed of 7 GHz for the signal CK_VCO. The 7 Ghz speed may be achieved by the apparatus 100 by implementing synthesis and/or place and route. The apparatus 100 may be implemented using standard CMOS logic gates (e.g., without using customized CMOS logic gates).

The apparatus 100 may be configured to receive the signal CK_DIV4 from the fixed divide-by-4 circuit 60 (e.g., Ndiv_hs may be fixed to 4). With Ndiv_hs fixed to 4, the fractional divider 102 may produce N, N+0.25, N+0.5 and N+0.75 as divide numbers to generate the average divider ratio. In the example with the reference clock CK_REF operating at 24 MHz, and the desired output clock CK_VCO operating at 6.348 GHz, the fractional divider 102 may generate the upper bound divide value integer 172 at 66.25 and the lower bound divide value integer 176 at 66 (e.g., compared to jumping between 66 and 67 as shown in association with FIG. 2). The fractional divider 102 may produce values of 66 and 66.25 to generate a value of 66.125 for the average fractional number 174. As a result, the apparatus 100 may perform similar to a wide range slow divider operating in a full rate.

Figure 5:
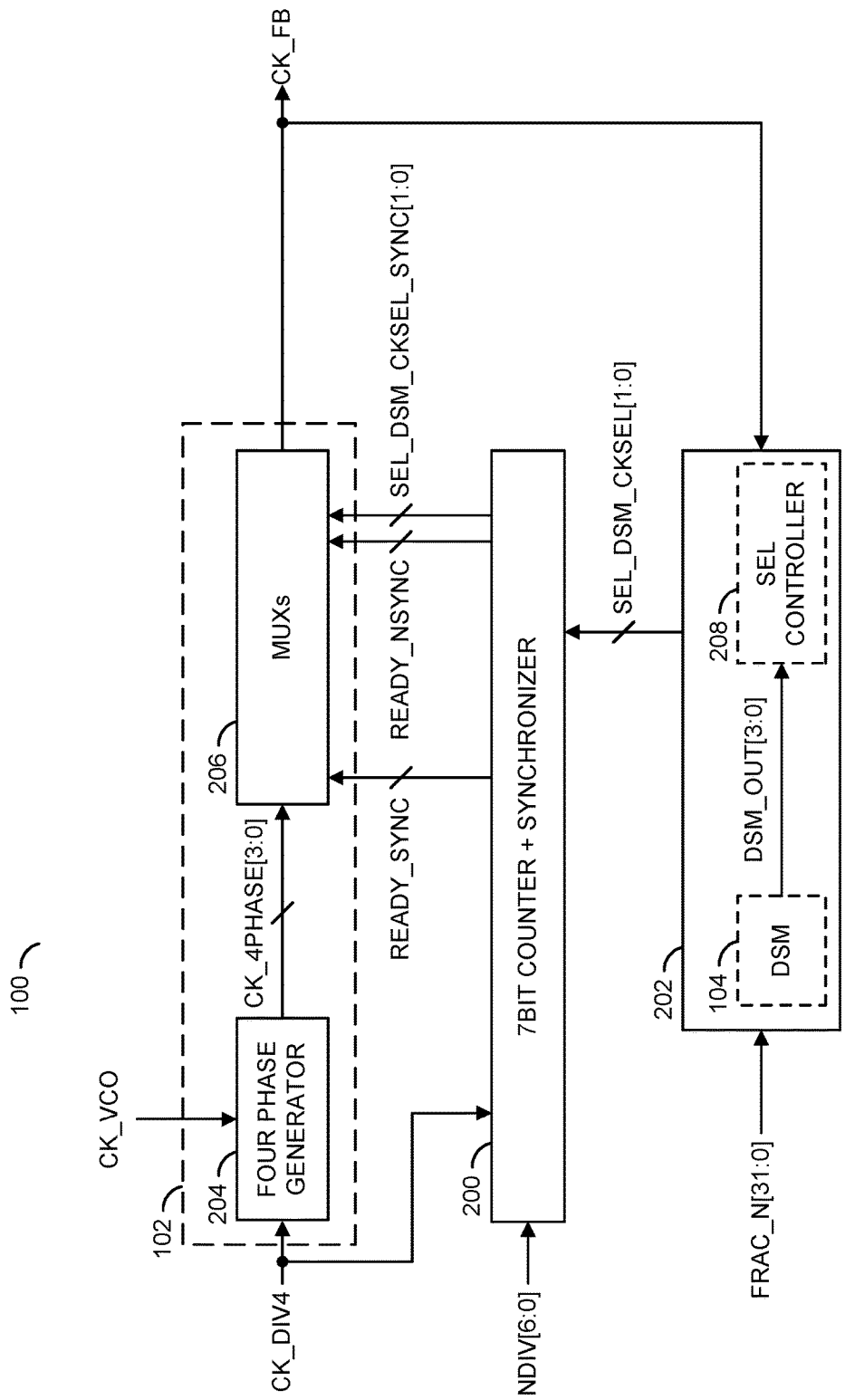
FIG. 5 is a block diagram illustrating components of the apparatus.

Referring to FIG. 5, a block diagram illustrating components of the apparatus 100 is shown. The apparatus 100 may comprise the fractional divider 102, a block (or circuit) 200 and/or a block (or circuit) 202. The circuit 200 may implement a counter and synchronizer block. The circuit 202 may implement a delta-sigma module and selection controller block. The apparatus 100 may comprise other components (not shown). For example, the other components of the apparatus 100 may comprise standard CMOS logic gates. The number, type and/or arrangement of the components of the apparatus 100 may be varied according to the design criteria of a particular implementation.

The fractional divider 102 may be configured to receive the signal CK_VCO, the signal CK_DIV4, a signal (e.g., READY_SYNC), a signal (e.g., READY_NSYNC) and/or a signal (e.g., SEL_DSM_CKSEL_SYNC[1:0]). The fractional divider 102 may be configured to generate the signal CK_FB. The signal READY_SYNC, the signal READY_NSYNC and/or the signal SEL_DSM_CKSEL_SYNC[1:0] may comprise ready and/or synchronization signals. The number and/or type of signals transmitted and/or received by the fractional divider 102 may be varied according to the design criteria of a particular implementation.

The fractional divider 102 may be a fully synthesizable CMOS device. The fractional divider 102 may be configured to interleave the four phase clock signals from the divided clock signal CK_DIV4. The fractional divider 102 may operate at a divide-by-4 clock speed (e.g., based on the signal CK_DIV4).

The fractional divider 102 may comprise a block (or circuit) 204 and/or a block (or circuit) 206. The circuit 204 may implement a four phase generator. The block 206 may comprise a multiplexer block. Details of the multiplexer block 206 may be described in association with FIG. 6. The fractional divider 102 may comprise other components (not shown). The number, type and/or arrangement of the components of the fractional divider 102 may be varied according to the design criteria of a particular implementation.

The counter and synchronizer block 200 may be configured to receive the signal CK_DIV4, a signal (e.g., SEL_DSM_CKSEL[1:0]) and/or a signal (e.g., NDIV). The signal NDIV may be a divider control signal. The signal NDIV may be a constant value. The signal SEL_DSM_CKSEL[1:0] may be a selection signal. The counter and synchronizer block 200 may generate the signal READY_SYNC, the signal READY_NSYNC and/or the signal SEL_DSM_CKSEL_SYNC[1:0]. In some embodiments, the counter and synchronizer block 200 may implement a 7-bit counter. For example, the signal NDIV may be a 7-bit signal. The signal SEL_DSM_CKSEL[1:0] may be a 2-bit signal. For example, the signal SEL_DSM_CKSEL[1:0] may be a selection signal.

The delta-sigma module and selection controller block 202 may be configured to receive the signal CK_FB and/or a signal (e.g., FRAC_N). The delta-sigma module and selection controller block 202 may be configured to generate the selection signal SEL_DSM_CKSEL[1:0]. In an example, the signal FRAC_N may be a 32-bit signal. The signal FRAC_N may be a constant value. The signal FRAC_N may be implemented to program the DSM 104.

For example, the signal FRAC_N may be used to determine the divider ratio of the apparatus 100. The number and/or type of signals transmitted and/or received by the delta-sigma module and selection controller block 202 may be varied according to the design criteria of a particular implementation.

The delta-sigma module and selection controller block 202 may comprise the DSM 104 and/or a block (or circuit) 208. The circuit 208 may implement a selection controller. The DSM 104 may generate a signal (e.g., DSM_OUT[3:0]). In an example, the signal DSM_OUT[3:0] may be generated in response to the signal FRAC_N. The selection controller 208 may receive the signal DSM_OUT[3:0]. The selection controller 208 may generate the signal SEL_DSM_CKSEL[1:0] in response to the signal DSM_OUT[3:0]. The delta-sigma module and selection controller block 202 may comprise other components (not shown). The number, type and/or arrangement of the components of the delta-sigma module and selection controller block 202 may be varied according to the design criteria of a particular implementation.

The counter and synchronization block 200 may be configured to reset a counter in response to the signal NDIV. In the example where the counter and synchronization block 200 implements a 7-bit counter, the 7-bit counter of the counter and synchronization block 200 may reset every NDIV[6:0] cycles. When the counter and synchronization block 200 is reset, the counter and synchronization block 200 may set the signal READY_SYNC and/or the signal READY_NSYNC to a logical low value (e.g., set to '0'). A synchronizer portion of the counter and synchronization block 200 may be configured to synchronize with the signal SEL_DSM_CKSEL[1:0] received from the delta-sigma module and selection controller block 202. For example, the selection signal SEL_DSM_CKSEL[1:0] may be synchronized in response to the divided clock signal CK_DIV4 (e.g., to enable the generation of the feedback signal CK_FB). The counter and synchronization block 200 may be configured to operate at a speed of FCK_VCO/4 (e.g., in the CK_DIV4 domain). The signal READY_SYNC, the signal READY_NSYNC and/or the signal SEL_DSM_CKSEL_SYNC[1:0] may be generated by the counter and synchronization block 200 in response to the selection signal SEL_DSM_CKSEL[1:0], the divided clock signal CK_DIV4 and/or the divider control signal NDIV.

The delta-sigma module and selection controller block 202 may be configured to select which of the four phase clock signals (e.g., CK_4PHASE) to pass through the multiplexer block 206. The selection signal (e.g., SEL_DSM_CKSEL[1:0]) may be generated by the delta-sigma module and selection controller block 202 to select one of the four phase clock signals CK_4PHASE to pass through as the signal CK_FB. The delta-sigma module and selection controller block 202 may operate at the speed of the signal CK_FB (e.g., in the CK_FB clock domain). For example, in the locking state, the frequency of the signal CK_FB may be equal to the frequency of the reference clock signal CK_REF. In some embodiments, the DSM 104 may be implemented in a MASH 1-1-1 structure.

The four phase generator 204 may be configured to receive the signal CK_VCO and/or the signal CK_DIV4. Generally, the frequency of the signal CK_VCO (e.g., FCK_VCO) may be up to approximately 7 GHz. The fixed, high-speed, divide-by-4 circuit 60 may be configured to output the signal CK_DIV4 operating at FCK_VCO/4. The four phase generator 204 may be configured to generate the signal CK_4PHASE. The signal CK_4PHASE may comprise four phase 90 degree clock signals operating at a frequency of FCK_VCO/4. The four phase generator 204 may be configured to use the output clock signal CK_VCO to synchronize the divided clock signal CK_DIV4.

The multiplexer block 206 may be configured to receive the four phase clock signals CK_4PHASE. The multiplexer block 206 may be operational to interleave the four phase clock signal CK_4PHASE using selection logic. The multiplexer block 206 may be configured to select one of the four phase clock signals from the signal CK_4PHASE as the feedback signal CK_FB. The multiplexer block 206 may select one of the four phase clock signals CK_4PHASE in response to the signal READY_SYNC, the signal READY_NSYNC and/or the synchronization signal SEL_DSM_CKSEL_SYNC[1:0] (e.g., generated in response to the selection signals SEL_DSM_CKSEL[1:0] generated by the DSM module 104 and/or the selection controller 208).

Figure 6:
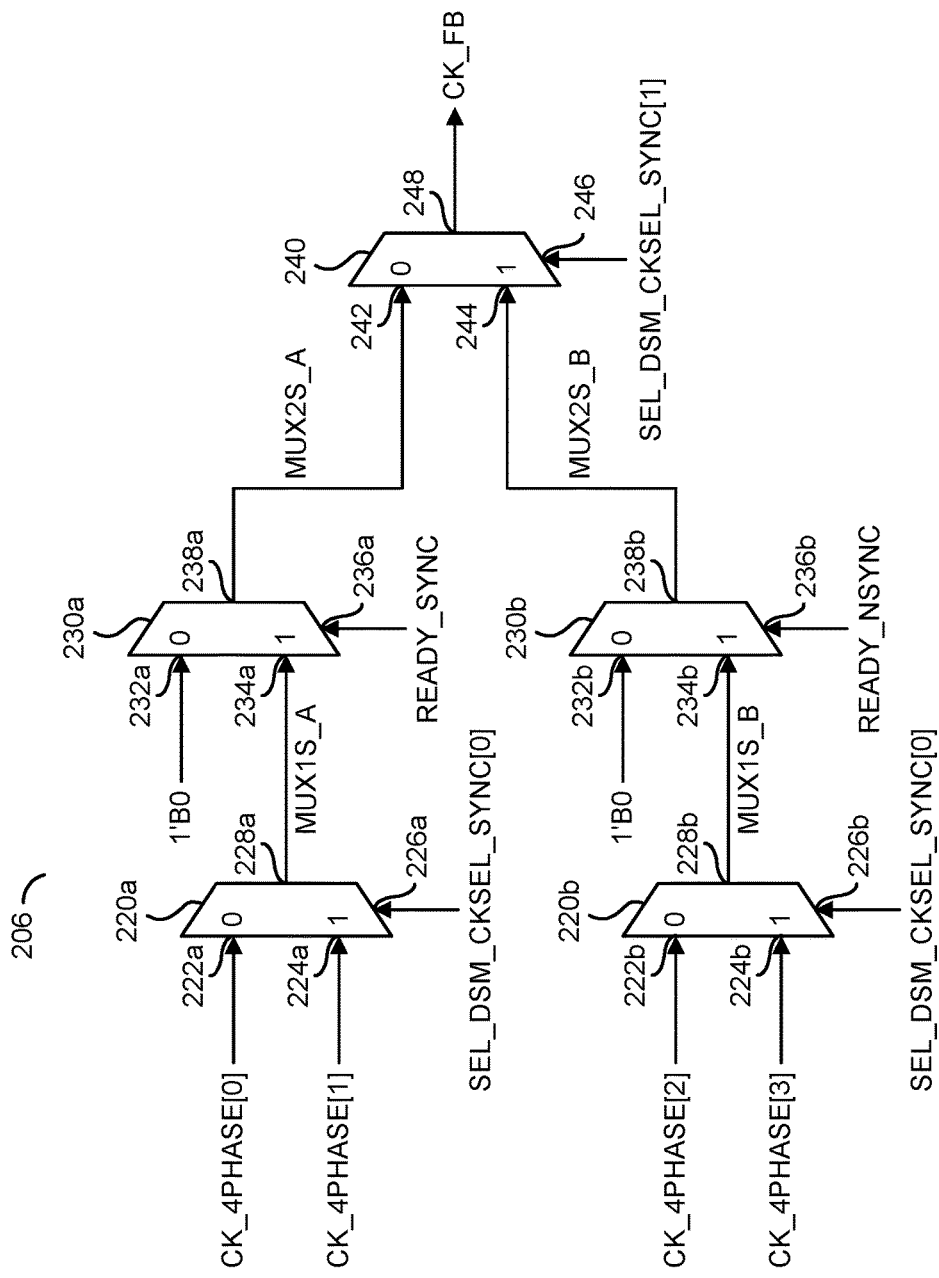
FIG. 6 is a diagram illustrating a multiplexer circuit.

Referring to FIG. 6, a diagram illustrating the multiplexer circuit 206 is shown. The multiplexer circuit 206 may comprise a number of blocks (or circuits) 220a-220b, a number of blocks (or circuits) 230a-230b and/or a block (or circuit) 240. The circuits 220a-220b may implement first stage multiplexers. The circuits 230a-230b may implement second stage multiplexers. The circuit 240 may implement a third stage multiplexer. In the example shown, there may be two first stage multiplexers 220a-220b and/or two second stage multiplexers 230a-230b. The multiplexer block 206 may comprise other components (not shown). The number, type and/or arrangement of the components of the multiplexer block 206 may be varied according to the design criteria of a particular implementation.

The first stage multiplexers 220a-220b, the second stage multiplexers 230a-230b and/or the third stage multiplexer 240 may be configured to implement selection logic of the multiplexer block 206. The selection logic may be operation to in response to the synchronization signal SEL_DSM_CKSEL_SYNC[1:0], the ready signal READY_NSYNC and/or the ready signal READY_SYNC. The selection logic may be configured to interleave the four phase clock signals (e.g., CK_4PHASE[0], CK_4PHASE[1], CK_4PHASE[2] and CK_4PHASE[3]).

The first stage multiplexers 220a-220b may each comprise respective inputs 222a-222b, inputs 224a-224b, inputs 226a-226b and/or outputs 228a-228b. The first input 222a of the first stage multiplexer 220a may receive one of the four phase clock signals (e.g., CK_4PHASE[0]) from the signal CK_4PHASE. The second input 224a of the first stage multiplexer 220a may receive one of the four phase clock signals (e.g., CK_4PHASE[1]) from the signal CK_4PHASE. Similarly, the first input 222b of the first stage multiplexer 220b may receive one of the four phase clock signals (e.g., CK_4PHASE[2]) and the second input 224b of the first stage multiplexer 220b may receive one of the four phase clock signals (e.g., CK_4PHASE[3]) from the signal CK_4PHASE.

The selection input 226a of the first stage multiplexer 220a may select one of the input 222a and the input 224a as the output 228a. The selection input 226a may receive a signal (e.g., SEL_DSM_CKSEL_SYNC[0]). The signal SEL_DSM_CKSEL_SYNC[0] may be a portion of the synchronization signal (e.g., SEL_DSM_CKSEL_SYNC[1:0]) generated by the counter and synchronizer block 200 and/or the DSM and selection block 202. The output 228a of the first stage multiplexer 220a may generate a signal (e.g., MUX1S_A). The signal MUX1S_A may be one of the signals CK_4PHASE[0] and CK_4PHASE[1] selected by the synchronization signal SEL_DSM_CKSEL_SYNC[0].

The selection input 226b of the first stage multiplexer 220b may select one of the input 222b and the input 224b as the output 228b. The selection input 226b may receive a signal (e.g., SEL_DSM_CKSEL_SYNC[0]). The signal SEL_ DSM_CKSEL_SYNC[0] may be a portion of the synchronization signal (e.g., SEL_DSM_CKSEL_SYNC[1:0]) generated by the counter and synchronizer block 200 and/or the DSM and selection controller block 202. The output 228b of the first stage multiplexer 220b may generate a signal (e.g., MUX1S_B). The signal MUX1S_B may be one of the signals CK_4PHASE[2] and CK_4PHASE[3] selected by the signal SEL_DSM_CKSEL_SYNC[0].

The second stage multiplexers 230a-230b may each comprise respective inputs 232a-232b, inputs 234a-234b, inputs 236a-236b and/or outputs 238a-238b. The first input 232a of the second stage multiplexer 230a may receive a signal 1'B0 (e.g., a constant logical low value and/or constant logical '0' value). The second input 234a of the second stage multiplexer 230a may receive the signal MUX1S_A from the output 228a of the first stage multiplexer 220a (e.g., one of the signal CK_4PHASE[0] and the signal CK_4PHASE[1]). Similarly, the first input 232b of the second stage multiplexer 230b may receive the signal 1'B0 and the second input 234b of the second stage multiplexer 230b may receive the signal MUX1S_B from the output 228b of the first stage multiplexer 220b (e.g., one of the signal CK_4PHASE[2] and the signal CK_4PHASE[3]).

The selection input 236a of the second stage multiplexer 230a may select one of the input 232a and the input 234a as the output 238a. The selection input 236a may receive a signal (e.g., READY_SYNC). The signal READY_SYNC may be generated by the counter and synchronizer block 200 and/or the DSM and selection controller block 202. The output 238a of the second stage multiplexer 230a may generate a signal (e.g., MUX2S_A). The signal MUX2S_A may be one of the signals 1'B0 and MUX1S_A selected by the ready signal READY_SYNC. For example, when the signal READY_SYNC goes to a logical low value, the output 238a may be a logical low (e.g., a logical '0') value.

The selection input 236b of the second stage multiplexer 230b may select one of the input 232b and the input 234b as the output 238b. The selection input 236b may receive the signal READY_NSYNC. The signal READY_NSYNC may be generated by the counter and synchronizer block 200 and/or the DSM and selection controller block 202. The output 238b of the second stage multiplexer 230b may generate a signal (e.g., MUX2S_B). The signal MUX2S_B may be one of the signals 1'B0 and MUX2S_B selected by the ready signal READY_NSYNC. For example, when the signal READY_NSYNC goes to a logical low value, the output 238b may be a logical low (e.g., a logical '0') value.

The third stage multiplexer 240 may comprise an input 242, an input 244, an input 246 and/or an output 248. The first input 242 of the third stage multiplexer 240 may receive the signal MUX2S_A from the output 238a of the second stage multiplexer 230a (e.g., one of the signal CK_4PHASE[0] and the signal CK_4PHASE[1]). The second input 242 of the third stage multiplexer 240 may receive the signal MUX2S_B from the output 238b of the second stage multiplexer 230b (e.g., one of the signal CK_4PHASE[2] and the signal CK_4PHASE[3]).

The selection input 246 of the third stage multiplexer 240 may select one of the input 242 and the input 244 as the output 248. The selection input 246 may receive the synchronization signal SEL_DSM_CKSEL_SYNC[1]. The signal SEL_DSM_CKSEL_SYNC[1] may be a portion of the synchronization signal (e.g., SEL_ DSM_CKSEL_SYNC[1:0]) generated by the counter and synchronizer block 200 and/or the DSM and selection controller block 202. The output 248 of the third stage multiplexer 240 may generate the signal CK_FB. The signal CK_FB may a selected one of the four phase signals CK_4PHASE[0], CK_4PHASE[1], CK_4PHASE[2] or CK_4PHASE[3] selected by the synchronization signal SEL_DSM_CKSEL_SYNC[1].

Figure 7:
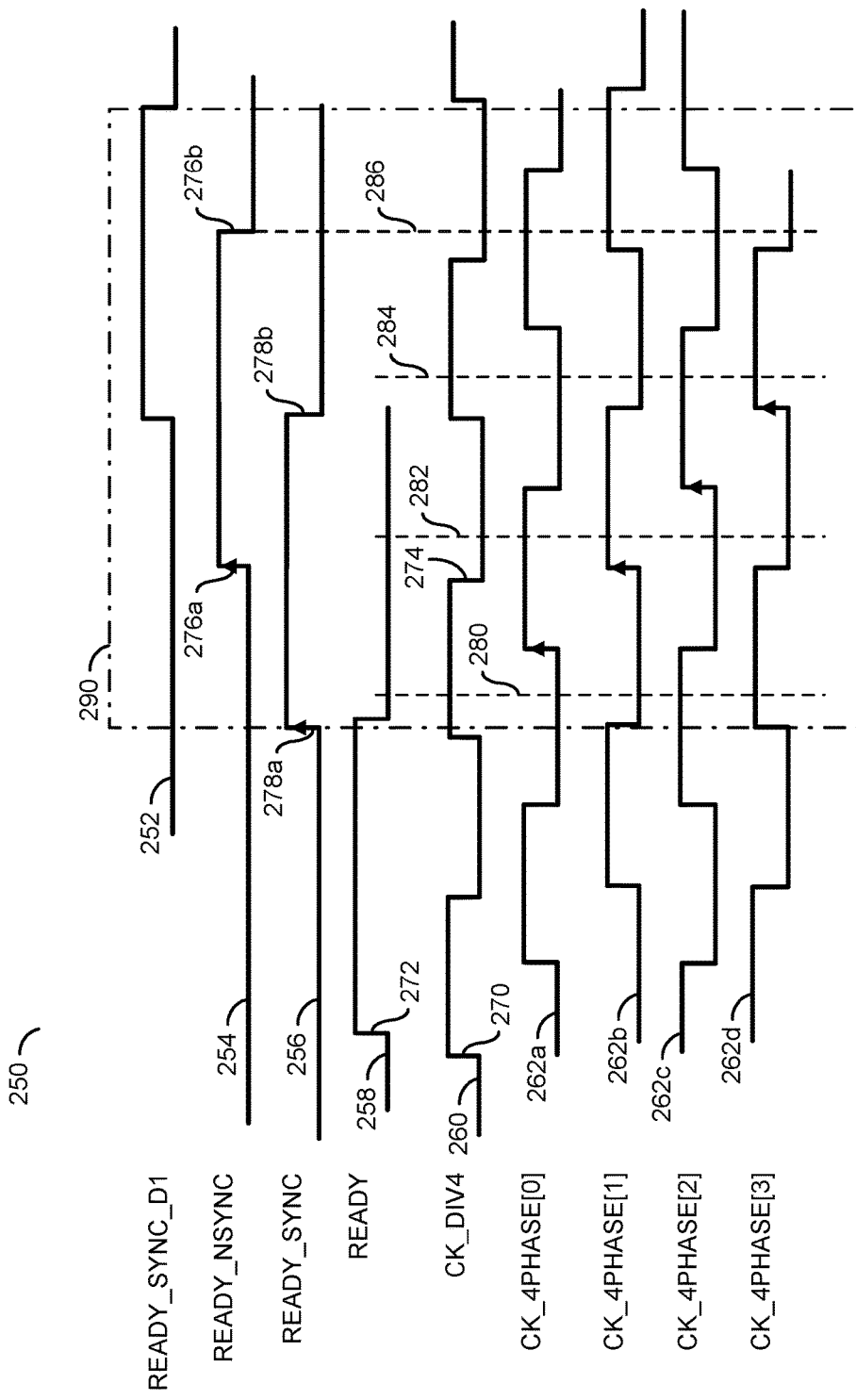
FIG. 7 is a diagram illustrating a timing graph for signals implemented by the apparatus.

Referring to FIG. 7, a diagram illustrating a timing graph 250 for signals implemented by the apparatus 100 is shown. The timing graph 250 may comprise a line 252, a line 254, a line 254, a line 256, a line 258, a line 260 and/or lines 262a-262d. The line 252 may represent an example response of a signal (e.g., READY_SYNC_D1). The signal READY_SYNC_D1 may be one of the ready signals. The signal READY_SYNC_D1 may have a one flop delay with respect to the signal READY_SYNC. The line 254 may represent an example response of the ready signal READY_NSYNC. The line 256 may represent an example response of the ready signal READY_SYNC. The line 258 may represent an example response of the ready signal READY. The line 260 may represent an example response of the divided clock signal CK_DIV4. The lines 262a-265d may represent example responses for the four phase signals CK_4PHASE[3:0].

The signal READY may be one of the ready signals (e.g., used to synchronize and/or select one of the four phase clock signals CD_4PHASE[3:0]). The signal READY may comprise the signal READY_SYNC, the signal READY_NSYNC and/or the signal READY_SYNC_D1. The signal READY, the signal READY_SYNC, the signal READY_NSYNC and/or the signal READY_SYNC_D1 may each be ready signals. Each of the signal READY, the signal READY_SYNC, the signal READY_NSYNC and/or the signal READY_SYNC_D1 may be generated within (e.g., internal to) the 7 bit counter of the counter and synchronizer block 200.

A transition 270 is shown in the response 260 for the signal CK_DIV4. The transition 270 may be a positive clock edge of the signal CK_DIV4. A transition 272 is shown in the response 258 for the signal READY. The transition 272 may be a positive edge of the signal READY. The positive clock edge 270 of the signal CK_DIV4 may trigger the positive edge 272 of the signal READY. In an example, the signal READY may be asserted (e.g., turned to a logical 1) when the 7 bit counter of the counter and synchronizer block 200 is equal to NDIV[6:0]−1.

A transition 274 is shown in the response 260 for the signal CK_DIV4. The transition 274 may be a negative clock edge. A transition 276a and a transition 276b are shown in the response 254 for the signal READY_NSYNC. The transition 276a may be a positive edge. The transition 276b may be a negative edge. The negative clock edge 274 of the signal CK_DIV4 may trigger the positive edge 276 of the signal READY_NSYNC. Since the signal CK_DIV4 may be positive edge triggered by the output signal CK_VCO, a duty cycle of 50% may be implemented. The transition 276a and/or the transition 276b of the signal READY_NSYNC may be inserted in the middle of a positive edge of the signal CK_4PHASE[1] and a positive edge of the signal CK_4PHASE[2] (e.g., to prevent a timing violation in the multiplexer block 206). In one example, the transition 276a is shown at approximately a line 282 after the positive edge of the signal CK_4PHASE[1] and before the positive edge of the signal CK_4PHASE[2]. In another example, the transition 278b is shown at approximately a line 286 after a positive clock edge of the signal CK_4PHASE[1] and before a positive clock edge of the signal CK_4PHASE[2].

A transition 278a and a transition 278b are shown in the response 256 for the signal READY_SYNC. The transition 278a may be a positive edge. The transition 278b may be a negative edge. The transition 278a and/or the transition 278b of the signal READY_SYNC may be inserted in the middle of a positive edge of the signal CK_4PHASE[0] and a positive edge of the signal CK_4PHASE[3] (e.g., to prevent a timing violation in the multiplexer block 206). In one example, the transition 278a is shown at approximately a line 280 before the positive edge of the signal CK_4PHASE [0] and after the positive edge of the signal CK_4PHASE[3]. In another example, the transition 278b is shown at approximately a line 284 before a positive clock edge of the signal CK_4PHASE[0] and after a positive clock edge of the signal CK_4PHASE[3].

The signal READY_SYNC may be implement one cycle later than the signal READY. The signal READY may be synchronized by a flip-flop implemented in the counter and synchronizer block 200 that is controlled by the signal CK_DIV4. The signal CD_DIV4 and the signal CK_4PHASE[3] may be the same phase clock.

An area 290 is shown. The area 290 may indicate a range of time when at least one of the signal READY_SYNC, the signal READY_NSYNC and/or the signal READY_SYNC_D1 is active (e.g., a logical high value). During the time of the area 290, the signals SEL_DS-M_CKSEL_SYNC[1:0] may not be updated. The signal CK_FB may be 0 when the ready signals are 0. All of the selection (e.g., control) signals may be configured to ensure that a correct pulse may be selected.

Figure 8:
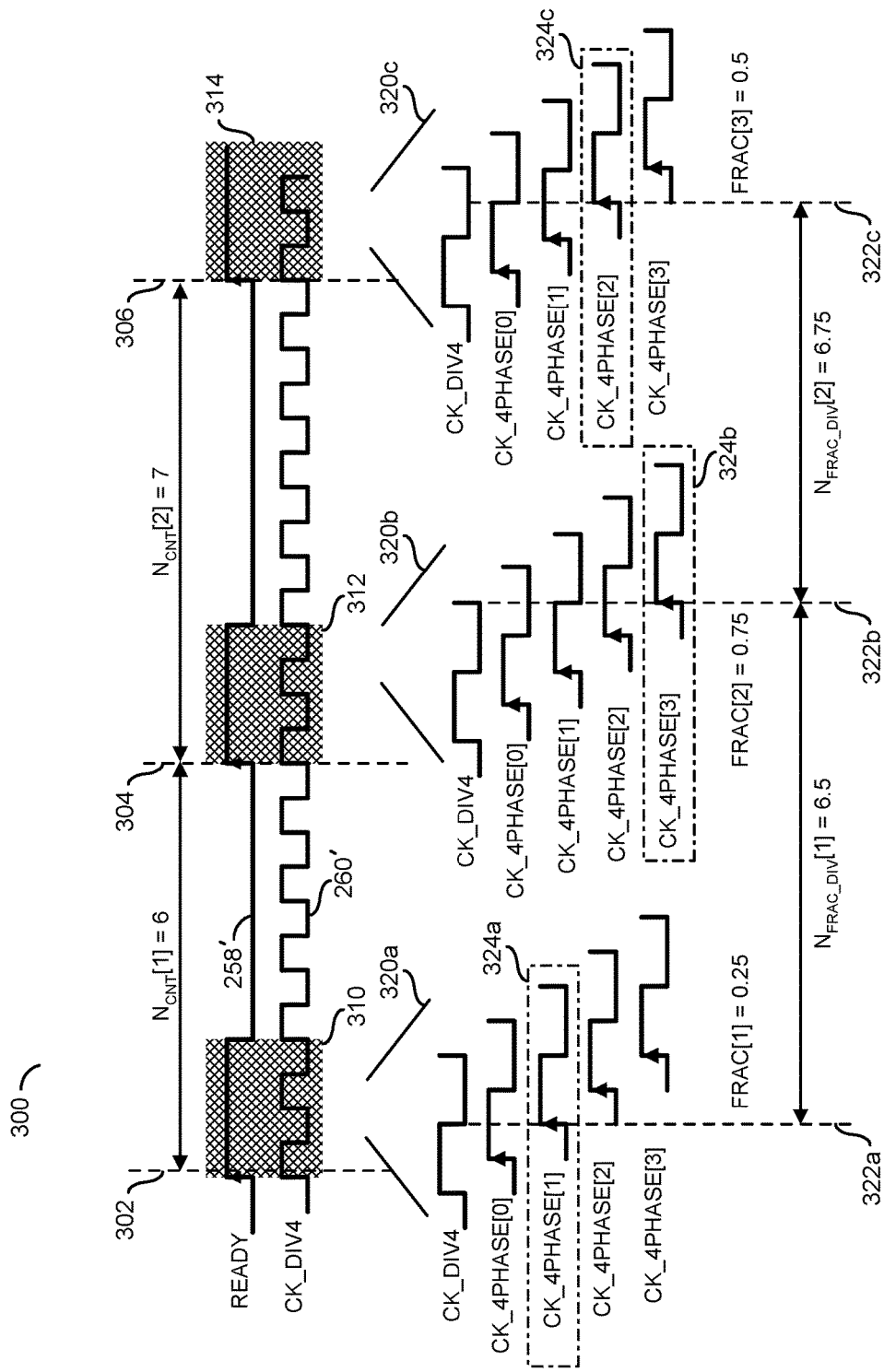
FIG. 8 is a diagram illustrating a timing graph for signals implemented by the apparatus.

Referring to FIG. 8, a diagram illustrating a timing graph 300 for signals implemented by the apparatus 100 is shown. The example timing diagram 300 may comprise the example representation 258' of the signal READY and the example representation 260' of the signal CK_DIV4. The timing diagram 300 may describe how to select the four phase, divide-by-four clock and/or generate the fractional number of the original clock speed.

The inputs of the apparatus 100 may comprise the division control signal NDIV[6:0] and/or the signal FRAC_N [31:0]. The signal DSM_OUT may be generated by the DSM module 104. The signal DSM_OUT may be presented to the selection controller 208. In an example, the signal DSM_OUT may be a 4-bit signal (e.g., DSM_OUT[3:0]). The selection controller 208 may be configured to interpret the signal DSM_OUT from the DSM 104 and, in response, output the signal SEL_DSM_CKSEL[1:0] for each clock cycle of the feedback clock signal CK_FB.

A value (e.g., NCNT) and a value (e.g., FRAC) are shown. The value NCNT and/or the value FRAC may be determined in response to the signal NDIV[6:0] and/or the signal FRAC_N[31:0]. The signal NDIV[6:0] and the signal FRAC_N[31:0] may be a constant value. For example, which of the cycles (e.g., CK_4PHASE[0], CK_4PHASE [1], CK_4PHASE[2] and CK_4PHASE[3]) of the signal CK_DIV4 to output pulse may be selected based in the value NCNT and/or the value FRAC. Using the value NCNT and/or the value FRAC, the fractional divide number (e.g., Nfrac_div[n]=FRAC[n+1]−FRAC[n]+Ncnt[n]) may be implemented.

A line 302, a line 304 and/or a line 306 is shown. The line 302 to the line 304 may represent a time when the value NCNT[1] is equal to 6. The line 304 to the line 306 may represents a time when the value NCNT[2] is equal to 7. An area 310, an area 312 and/or an area 314 is shown. Groups of signals 320a-320c are shown. The group of signals 320a may correspond to the area 310 of the signal READY and the signal CK_DIV4 when the value NCNT[1] is equal to 6 and the signal READY is a logical high. The group of signals 320b may correspond to the area 312 of the signal READY and the signal CK_DIV4 when the value NCNT[2] is equal to 7 and the signal READY is a logical high. The group of signals 320c may correspond to the area 314 of the signal READY and the signal CK_DIV4 after the value NCNT[2] is equal to 7 and the signal READY is a logical high.

The group of signals 320a-320c may comprise a portion of the signal CK_DIV4, the signal CK_4PHASE[0], the signal CK_4PHASE[1], the signal CK_4PHASE[2] and the signal CK_4PHASE[3]. Lines 322a-322c are shown. Each of the lines 322a-322c may correspond with one of the groups of signals 320a-320c. The line 322a may represent a time when the value FRAC[1] is equal to 0.25. The line 322b may represent a time when the value FRAC[2] is equal to 0.75. The line 322c may represent a time when the value FRAC[3] is equal to 0.5. Between the line 322a and the line 322b may represent a time when the value Nfrac_div[1] is equal to 6.5. Between the line 322b and the line 322c may represent a time when the value Nfrac_div[2] is equal to 6.75.

In each of the groups of signals 320a-320c, a respective selection 324a-324c is shown. In the group of signals 320a, the selection 324a may be the signal CK_4PHASE[1]. The signal CK_4PHASE[1] may correspond to a value of FRAC equal to 0.25. In the group of signals 320b, the selection 324b may be the signal CK_4PHASE[3]. The signal CK_4PHASE[3] may correspond to a value of FRAC equal to 0.75. In the group of signals 320c, the selection 324c may be the signal CK_4PHASE[2]. The signal CK_4PHASE[2] may correspond to a value of FRAC equal to 0.5. Similarly, the signal CK_4PHASE[0] may correspond to a value of FRAC equal to 0. By selecting one of the signals CK_4PHASE[0] (e.g., 0), CK_4PHASE[1] (e.g., 0.25), CK_4PHASE[2] (e.g., 0.5) and CK_4PHASE[3] (e.g., 0.75) may enable the fractional divider 102 to produce divide numbers of N, N+0.25, N+0.5 and N+0.75.

The functions performed by the diagrams of FIGS. 1-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a fractional divider circuit configured to generate a feedback clock signal in response to a selection signal, a divided clock signal and an output clock signal;
   a modulator circuit configured to generate said selection signal in response to said feedback clock signal, wherein (a) said fractional divider circuit generates four phase clock signals from said divided clock signal, (b) said four phase clock signals are interleaved by said fractional divider circuit to select one of said four phase clock signals as said feedback clock signal, (c) said fractional divider circuit operates at a divide-by-4 clock speed, (d) said selection signal is synchronized in response to said divided clock signal to generate said feedback clock signal and (e) said fractional divider circuit is implemented using CMOS logic, and
   a counter circuit and synchronizer circuit.

2. The apparatus according to claim 1, wherein said fractional divider circuit is a fully synthesizable CMOS device.

3. The apparatus according to claim 1, wherein (i) said divided clock signal is generated by a fixed divide-by-4 divider circuit in response to said output clock signal and (ii) a frequency of said divided clock signal is one quarter of a frequency of said output clock signal.

4. The apparatus according to claim 1, wherein said fractional divider circuit generates said four phase signals to produce divide numbers interleaving N, N+0.25, N+0.5 and N+0.75 to generate an average divider ratio.

5. The apparatus according to claim 1, wherein said fractional divider circuit comprises a four phase generator and a multiplexer circuit.

6. The apparatus according to claim 5, wherein said four phase generator generates said four phase clock signals from said divided clock signal using said output clock signal to synchronize with said divided clock signal.

7. The apparatus according to claim 5, wherein said multiplexer circuit receives said four phase clock signals and presents one of said four phase clock signals as said feedback clock signal in response to a synchronization signal and a ready signal.

8. The apparatus according to claim 7, wherein said synchronization signal and said ready signal are generated in response to said selection signal, said divided clock signal and a divider control signal.

9. The apparatus according to claim 5, wherein said multiplexer circuit is configured implement a selection logic to interleave said four phase clock signals.

10. The apparatus according to claim 1, wherein said counter circuit is configured to generate a ready signal and a synchronization signal for said fractional divider circuit.

11. The apparatus according to claim 10, wherein said counter circuit implements a seven bit counter configured to reset after a pre-determined number of cycles.

12. The apparatus according to claim 1, wherein said synchronizer circuit is configured to synchronize said selection signal.

13. The apparatus according to claim 1, wherein (i) said output clock signal is generated in response to an input clock signal and (ii) a maximum frequency of said input clock signal is approximately 7 GHZ.

14. The apparatus according to claim 1, wherein said CMOS logic is implemented without customized CMOS logic gates.

15. The apparatus according to claim 1, wherein said apparatus reduces a chip-size area and an amount of power consumption compared to using at least one of (a) a calibration scheme, (b) current mode logic (CML) and (c) customized CMOS logic.

16. The apparatus according to claim 1, wherein said CMOS logic is implemented using FinFET technology.

17. The apparatus according to claim 1, wherein said counter and synchronize circuit is connected between said fractional divider circuit and said modulator circuit.

18. An apparatus comprising:
a fractional divider circuit configured to generate a feedback clock signal in response to a selection signal, a divided clock signal and an output clock signal; and
a modulator circuit configured to generate said selection signal in response to said feedback clock signal, wherein (a) said fractional divider circuit generates four phase clock signals from said divided clock signal, (b) said four phase clock signals are interleaved by said fractional divider circuit to select one of said four phase clock signals as said feedback clock signal, (c) said fractional divider operates at a divide-by-4 clock speed, (d) said selection signal is synchronized in response to said divided clock signal to generate said feedback clock signal, (e) said fractional divider circuit is implemented using CMOS logic, (f) said fractional divider circuit comprises a four phase generator and multiplexer circuit, and (g) said multiplexer circuit receives said four phase clock signals and presents one of said four phase clock signals as said feedback clock signal in response to a synchronization signal and a ready signal.

\* \* \* \* \*